(12) United States Patent
Tanzawa

(10) Patent No.: US 8,780,631 B2
(45) Date of Patent: Jul. 15, 2014

(54) MEMORY DEVICES HAVING DATA LINES INCLUDED IN TOP AND BOTTOM CONDUCTIVE LINES

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 13/590,964

(22) Filed: Aug. 21, 2012

(65) Prior Publication Data
US 2014/0056049 A1 Feb. 27, 2014

(51) Int. Cl.
*G11C 16/04* (2006.01)

(52) U.S. Cl.
USPC .................................. 365/185.17; 365/185.21

(58) Field of Classification Search
USPC ......................................... 365/185.17, 185.21
See application file for complete search history.

(56) References Cited

U.S. PATENT DOCUMENTS

| | | | |
|---|---|---|---|
| 5,345,563 A | 9/1994 | Uihlein et al. | |
| 5,828,621 A | 10/1998 | Tanzawa et al. | |
| 6,118,696 A | 9/2000 | Choi | |
| 6,643,159 B2 | 11/2003 | Fricke et al. | |
| 8,097,504 B2 | 1/2012 | Mokhlesi et al. | |
| 8,278,170 B2 | 10/2012 | Lee et al. | |
| 8,383,482 B2 | 2/2013 | Kim et al. | |
| 8,395,190 B2 | 3/2013 | Shim et al. | |
| 8,593,869 B2 | 11/2013 | Tanzawa | |
| 2010/0012997 A1 | 1/2010 | Jang et al. | |
| 2010/0271885 A1 | 10/2010 | Scheuerlein et al. | |
| 2011/0002178 A1* | 1/2011 | Hwang et al. | 365/189.011 |
| 2011/0115010 A1 | 5/2011 | Shim et al. | |
| 2011/0205776 A1* | 8/2011 | Murata | 365/72 |
| 2012/0003828 A1 | 1/2012 | Chang et al. | |
| 2012/0047321 A1 | 2/2012 | Yoon et al. | |
| 2012/0051137 A1* | 3/2012 | Hung et al. | 365/185.17 |
| 2012/0068259 A1 | 3/2012 | Park et al. | |
| 2012/0147651 A1 | 6/2012 | Scheuerlein et al. | |
| 2012/0182804 A1 | 7/2012 | Hung et al. | |
| 2013/0028023 A1 | 1/2013 | Tanzawa | |
| 2013/0028024 A1 | 1/2013 | Tanzawa | |
| 2013/0148427 A1 | 6/2013 | Lee | |
| 2013/0163305 A1 | 6/2013 | Tanzawa | |

OTHER PUBLICATIONS

Cernea, Raul, et al., "A 34MB/s-Program-Throughput 16Gb MLC NAND with All-Bitline Architecture in 56nm", ISSCC Session 23.1, Non-Volatile Memory, (Feb. 2008), 420-421, 624.

Chiang, M H, "Novel High-Density Low-Power Logic Circuit Techniques Using DG Devices", IEEE ED, 52(10), (Oct. 2005), 2339-42.

(Continued)

*Primary Examiner* — Hoai V Ho
(74) *Attorney, Agent, or Firm* — Schwegman, Lundberg Woessner, P.A.

(57) ABSTRACT

Some embodiments include apparatuses and methods having a first set of conductive lines, a second set of conductive lines, and memory cells located in different levels of the apparatuses and arranged in memory cell strings. At least a portion of the first set of conductive lines is configured as a first set of data lines. At least a portion of the second set of conductive lines is configured as a second set of data lines. Each of the memory strings is coupled to a respective conductive line in the first set of conductive lines and a respective conductive line in the second set of conductive lines. Other embodiments including additional apparatuses and methods are described.

12 Claims, 9 Drawing Sheets

(56) References Cited

OTHER PUBLICATIONS

Crowley, Matthew, et al., "512 Mb PROM with 8 Layers of Antifuse/Diode Cells", IEEE International Solid-State Circuits Conference 2003 Digest of Papers, (Feb. 11, 2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a Three-Dimensional Array of Diode/Antifuse Memory Cells", IEEE Journal of Solid-State Circuits, vol. 38, No. 11, (Nov. 2003), 1920-1928.

Katsumata, R, et al., "Pipe-shaped BiCS flash memory with 16 stacked layers and multi-level-cell operation for ultra high density storage devices", Symposium on VLSI Technology, (Jun. 2009), 136-37.

Kim, J, et al., "Novel Vertical-Stacked Array-Transistor (VSAT) for ultra-high-density and cost-effective NAND Flash memory devices and SSD (Solid State Drive)", Symposium on VLSI Technology, (2009), pp. 186-187.

Kim, W, et al., "Multi-layered Vertical Gate NAND Flash overcoming stacking limit for terabit density storage", Symposium on VLSI Technology, (Jun. 2009), 188-89.

Sakui, K, et al., "Design Impacts on NAND Flash Memory Core Circuits with Vertical MOSFETs", IEEE International Memory Workshop (IMW), (May 2010), 4 pgs.

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.

Tanzawa, T., et al., "Circuit techniques for a 1.8-V-only NAND flash memory", IEEE Journal of Solid-State Circuits, 37(1), (Jan. 2002), 84-89.

* cited by examiner

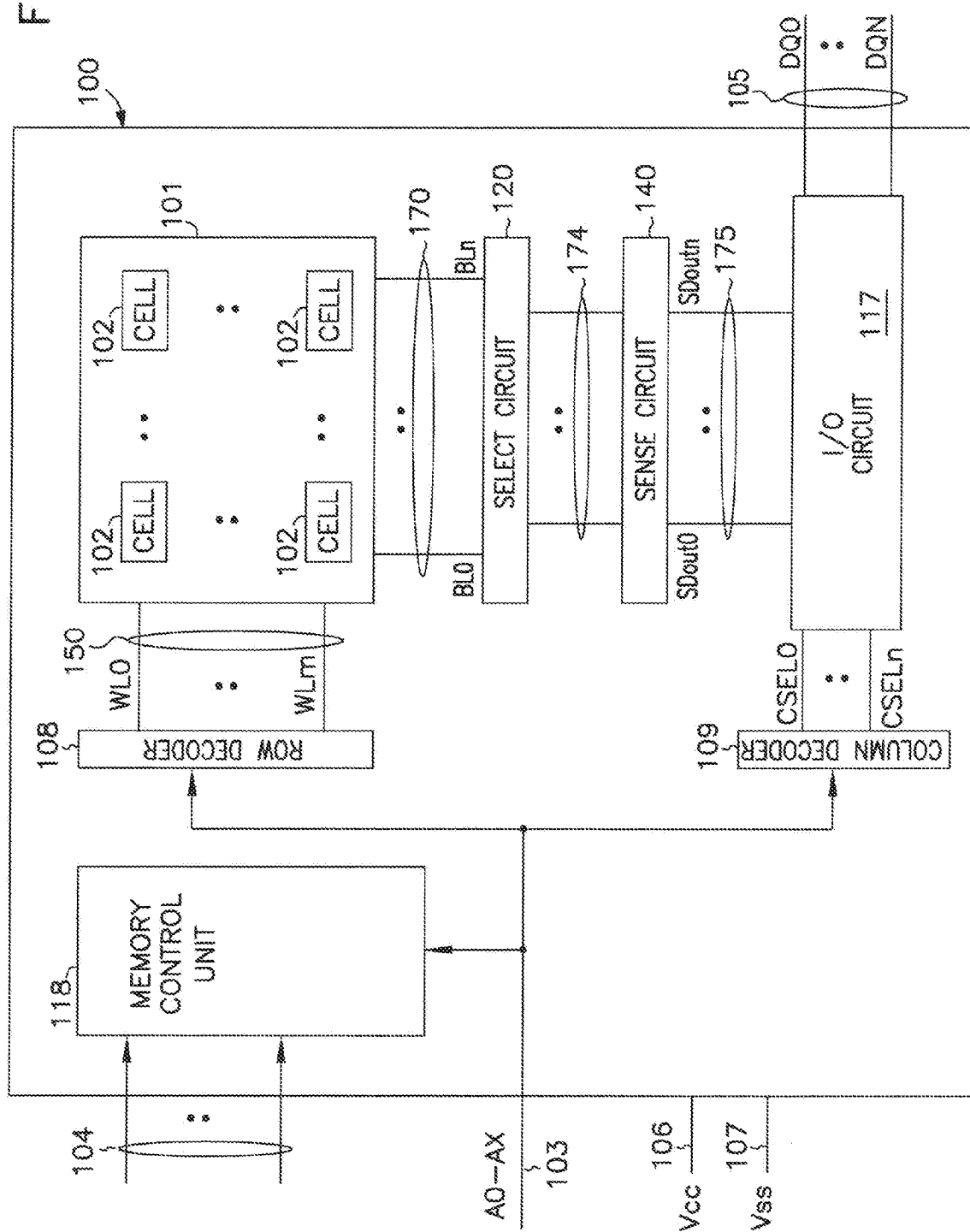

200

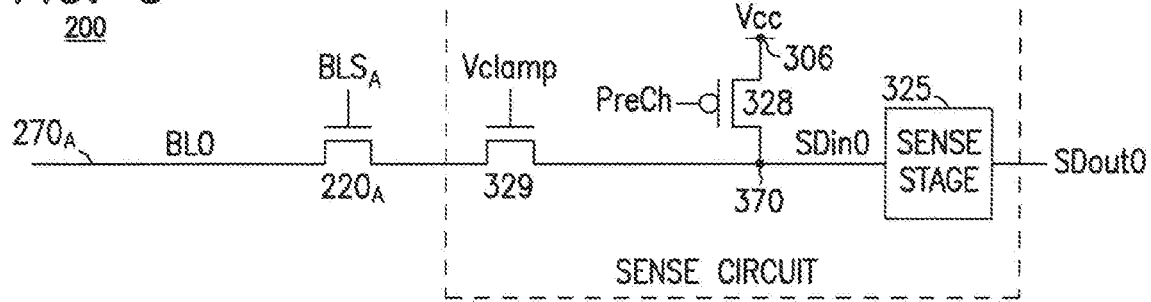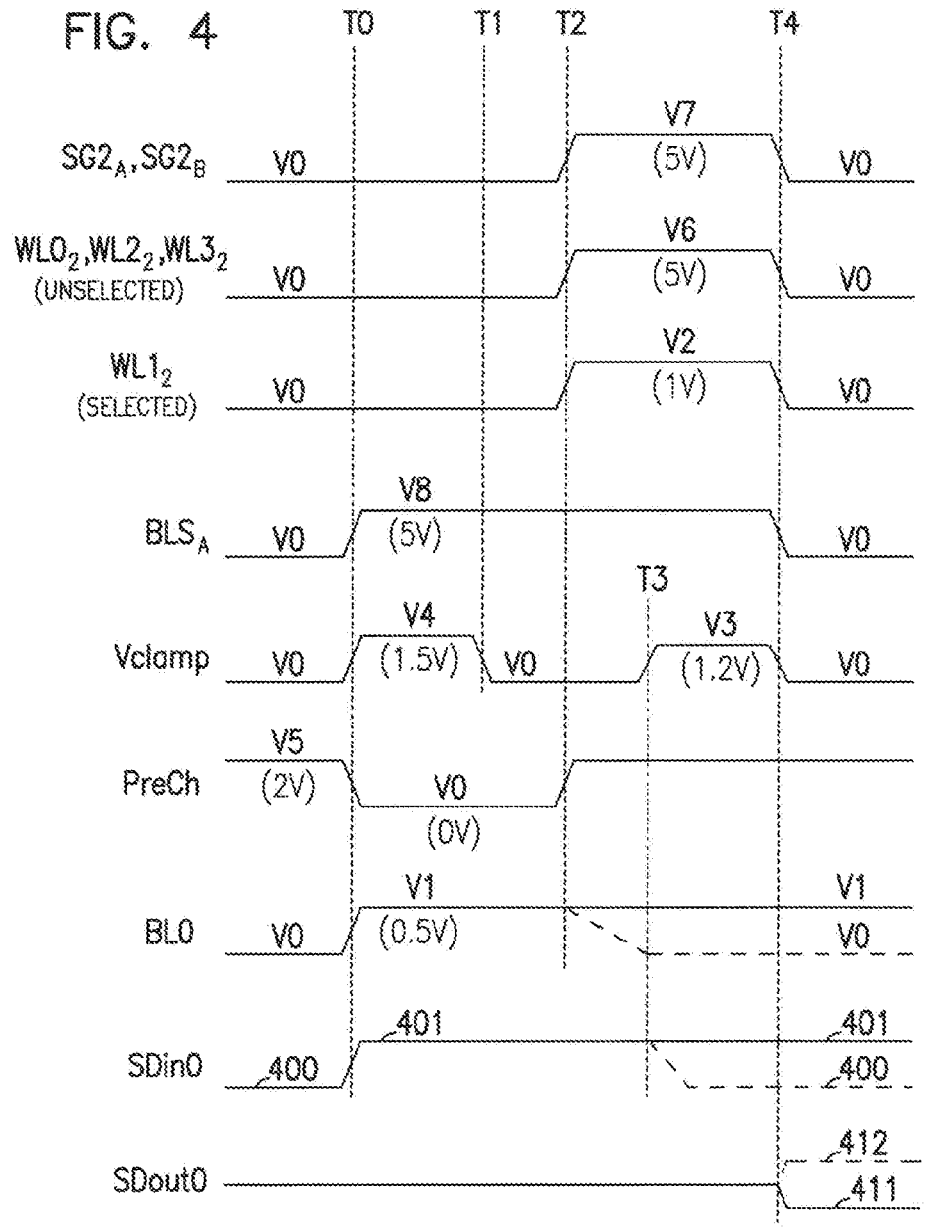

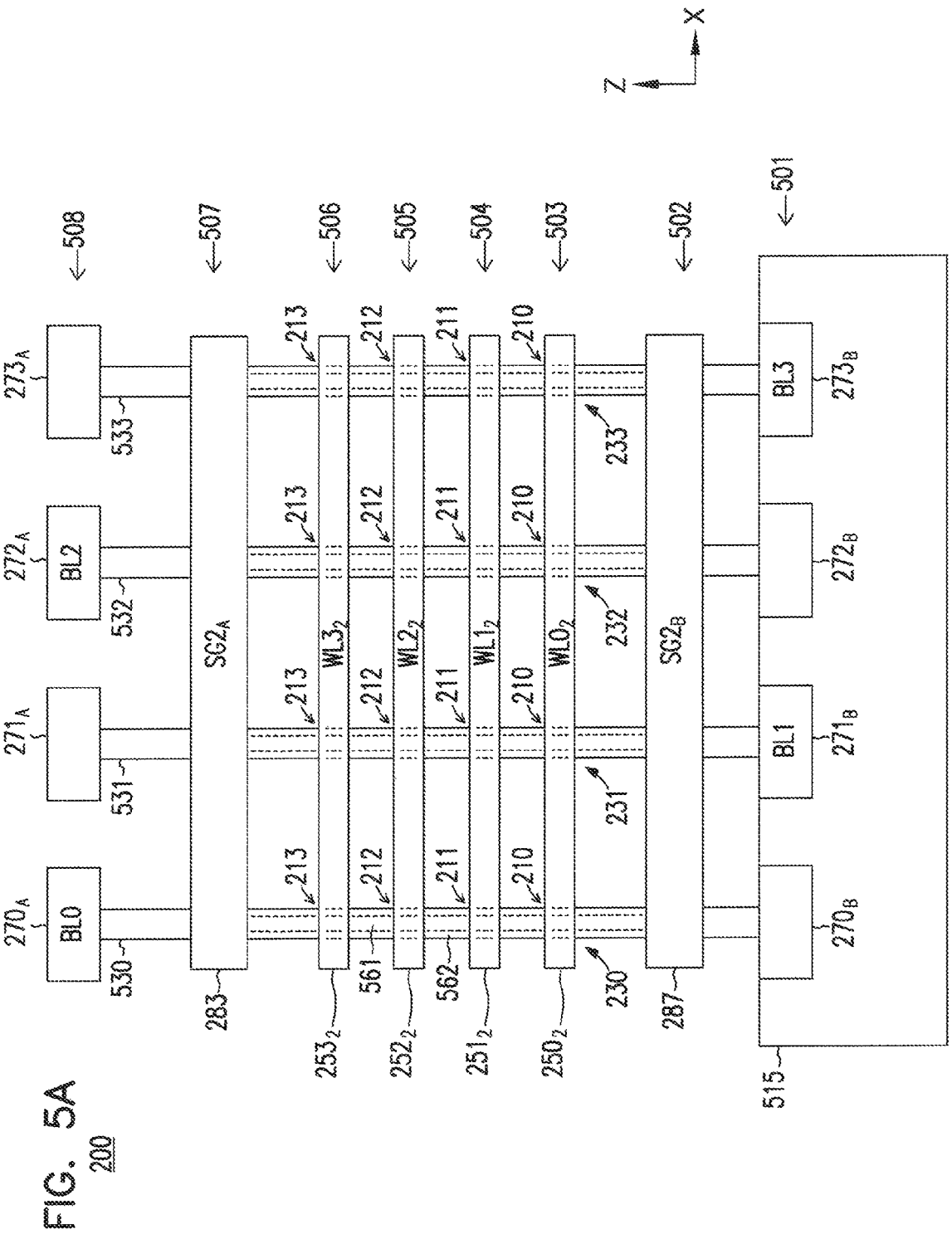

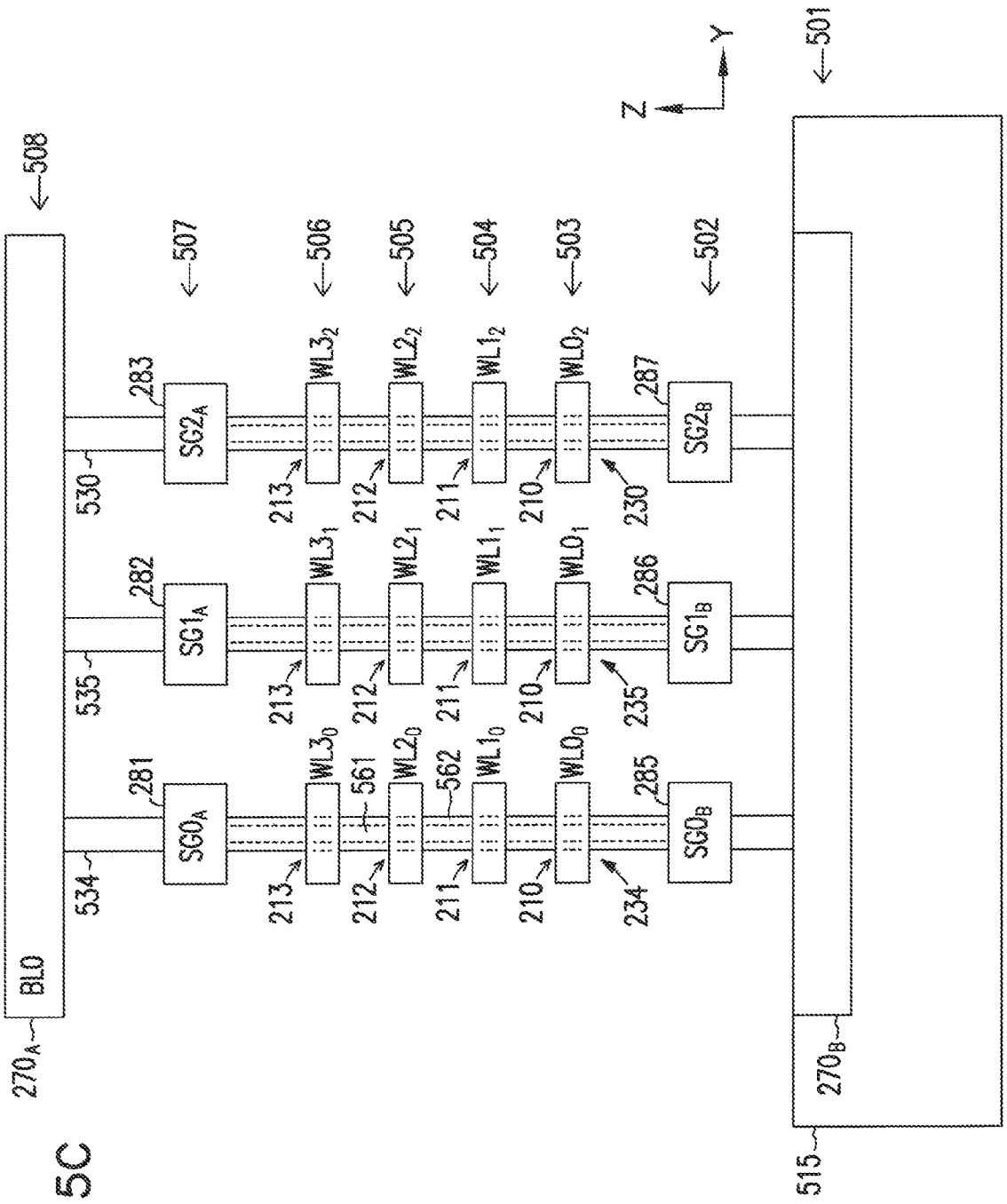

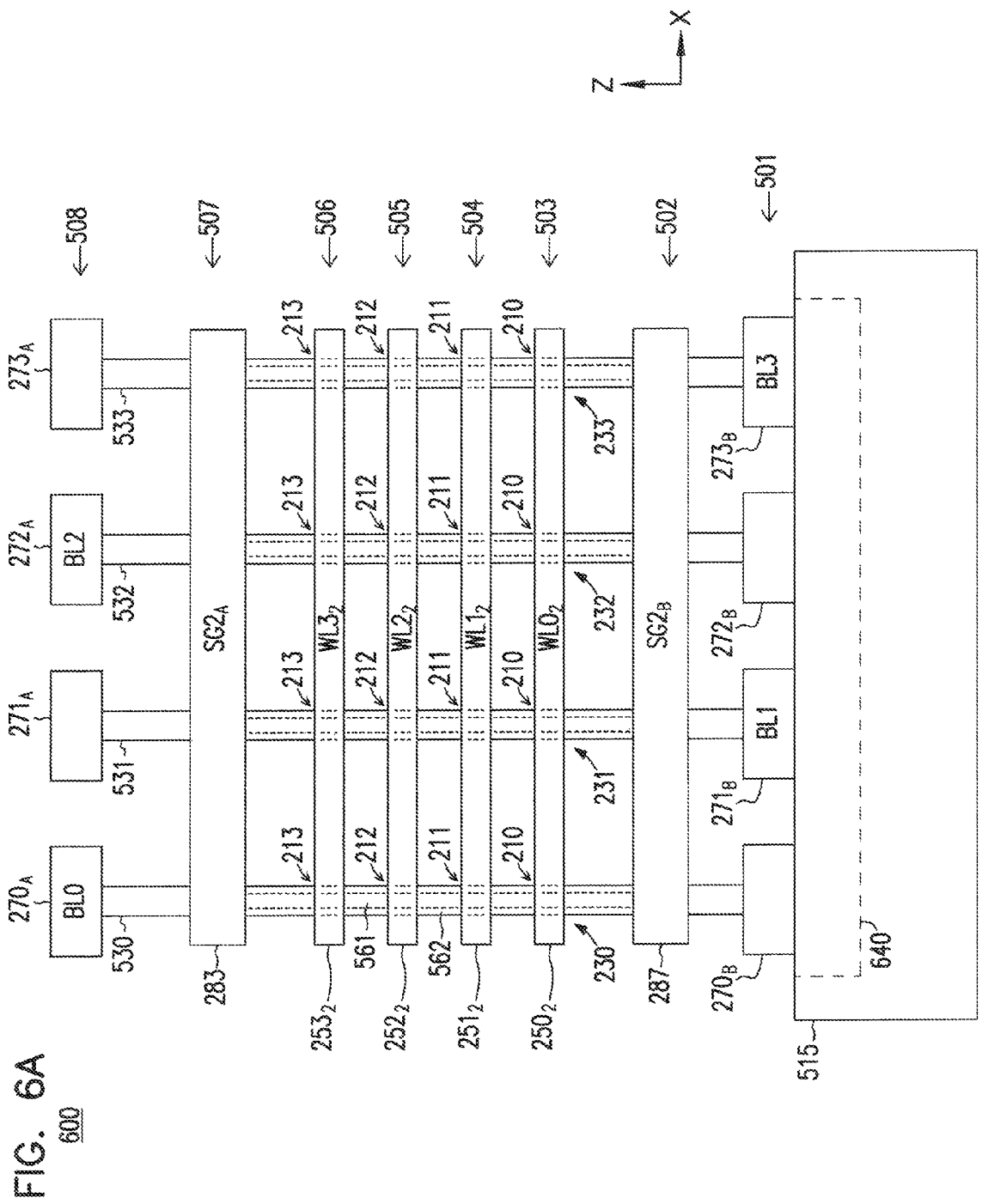

FIG. 6B
600

MEMORY DEVICES HAVING DATA LINES INCLUDED IN TOP AND BOTTOM CONDUCTIVE LINES

BACKGROUND

Memory devices, such as flash memory, are widely used in computers and many electronic items. Such memory devices usually have numerous memory cells to store information. Some conventional memory devices may consume relatively less power but they may have lower data throughput. Some other memory devices may have a relatively higher data throughput but they may have higher power consumption. In some cases, designing a memory device with both improved data throughput and power consumption may pose a challenge.

BRIEF DESCRIPTION OF THE DRAWINGS

FIG. 1 shows a block diagram of an apparatus in the form of a memory device, according to an embodiment of the invention.

FIG. 3 shows a schematic diagram of a portion of the memory device of FIG. 2A including a sense circuit, according to an embodiment of the invention.

FIG. 4 is a timing diagram for the signals of FIG. 3 during an example read operation, according to an embodiment of the invention.

FIG. 5A shows a side view of a portion of a structure of the memory device of FIG. 2A, according to an embodiment of the invention.

FIG. 5C shows another side view of a portion of the structure of the memory device of FIG. 2A, according to an embodiment of the invention.

FIG. 6A shows a side view of a portion of a structure of the memory device having bottom data lines formed over a substrate, according to an embodiment of the invention.

FIG. 6B shows another side view of a portion of the structure of the memory device of FIG. 6A, according to an embodiment of the invention.

DETAILED DESCRIPTION

Figure 2A:
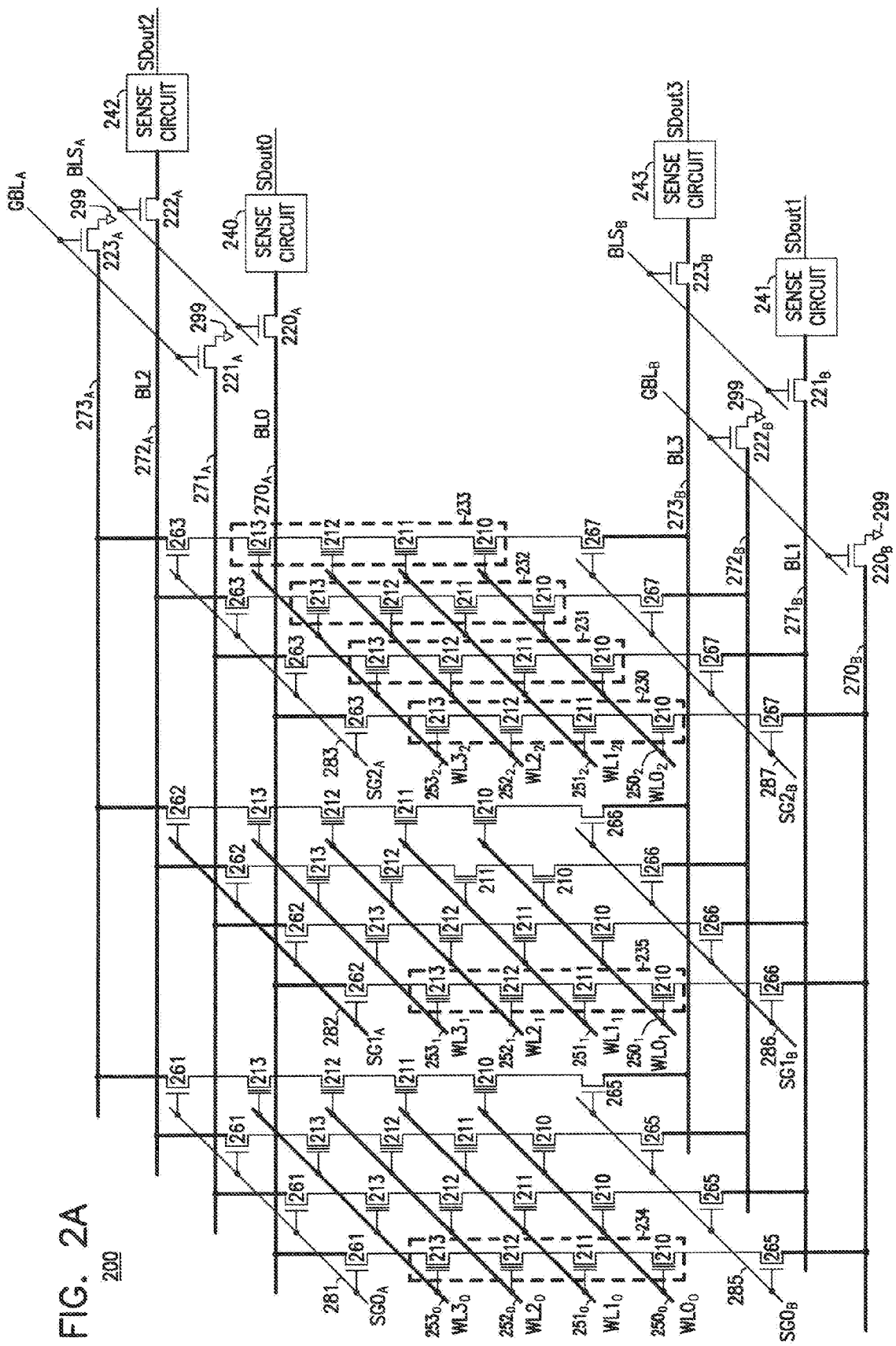
FIG. 2A shows a schematic diagram of a portion of a memory device having a set of top data lines formed from a set of conductive lines and another set of bottom data lines formed from another set of conductive lines, according to an embodiment of the invention.

FIG. 1 shows a block diagram of an apparatus in the form of a memory device 100 having a memory array 101 with memory cells 102, according to an embodiment of the invention. Memory cells 102 can be arranged in rows and columns along with lines 150 and lines 170. Lines 150 can carry signals WL0 through WLm and can form part of access (e.g., word) lines of memory device 100. Lines 170 can carry signals BL0 through BLn and can form part of array data lines (e.g., bit lines) of memory device 100.

Memory device 100 may use lines 150 to access memory cells 102, and lines 170 to exchange information (e.g., provide signals) with memory cells 102. A row decoder 108 and a column decoder 109 decode address signals A0 through AX on lines 103 (e.g., address lines) to determine which memory cells 102 are to be accessed in a memory operation.

Memory device 100 can perform memory operations such as a read operation to read information from memory cells 102 and a write (e.g., programming) operation to write (e.g., program) information into memory cells 102. Memory device 100 can also perform an erase operation to clear information from some or all of memory cells 102.

A memory control unit 118 controls memory operations of memory device 100 based on control signals on lines 104. Examples of the control signals on lines 104 include one or more clock signals and other signals to indicate which operation (e.g., read, programming, or erase operation) memory device 100 can perform.

Other devices external to memory device 100 (e.g., a memory access device, such as a processor or a memory controller) can control the values of the control signals on lines 104. Specific values of a combination of the signals on lines 104 can produce a command (e.g., read, programming, or erase command) that can cause memory device 100 to perform a corresponding memory operation (e.g., read, programming, or erase operation).

Memory device 100 can include a select circuit 120 that is configured to selectively couple lines 170 associated with memory cells 102 to sense circuit 140 through lines 174 in a memory operation, such as a read operation.

Sense circuit 140 is configured to determine the value of information from memory cells 102 in a memory operation, such as a read operation, and provide the information in the form of signals to lines 175 (e.g., data lines). Sense circuit 140 can also use the signals on lines 175 to determine the value of information to be written (e.g., programmed) into memory cells 102.

Memory device 100 can include an input/output (I/O) circuit 117 to exchange information between memory array 101 and lines (e.g., data lines) 105. I/O circuit 117 can respond to signals CSEL0 through CSELn to select the signals on lines 175 that can represent the information read from or programmed into memory cells 102. Column decoder 109 can selectively activate the CSEL0 through CSELn signals based on the A0 through AX address signals on lines 103. I/O circuit 117 can select the signals on lines 175 to exchange information between memory array 101 and lines 105 during read and programming operations.

Signals DQ0 through DQN on lines 105 can represent information to be read from or written into memory cells 102. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Each of memory cells 102 can be programmed (e.g., programmed to have a certain state) to store information representing a value of a fraction of a bit, a value of a single bit, or a value of multiple bits such as two, three, four, or another number of bits. For example, each of memory cells 102 can be programmed to store information representing a binary value "0" or "1" of a single bit. The single bit per cell is sometimes called a single level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can receive a supply voltage, including supply voltages Vcc and Vss, on lines 106 and 107, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a non-volatile memory device, and memory cells 102 can include non-volatile memory cells, such that memory cells 102 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive random access memory (RAM) device).

Memory device 100 can include a memory device where memory cells 102 can be physically located in multiple levels on the same device, such that some of memory cells 102 can be stacked over some other memory cells 102 in multiple levels over a substrate (e.g., a semiconductor substrate) of memory device 100.

One of ordinary skill in the art may recognize that memory device 100 may include other elements, several of which are not shown in FIG. 1 so as not to obscure the embodiments described herein.

Memory device 100 may include memory devices and operate using memory operations (e.g., read, programming, and erase operations) similar to or identical to memory devices and operations described below with reference to FIG. 2A through FIG. 6B.

FIG. 2A shows a schematic diagram of a portion of a memory device 200 having a set of lines $270_A$, $271_A$, $272_A$, and $273_A$ and a set of lines $270_B$, $271_B$, $272_B$, and $273_B$, according to an embodiment of the invention. Lines 270, 271, 272, and 273 can be structured as a set of conductive lines. Lines $270_B$, $271_B$, $272_B$, and $273_B$ can be structured as another set of conductive lines.

At least a portion of lines $270_A$, $271_A$, $272_A$, and $273_A$ (e.g., lines $270_A$ and $272_A$) can be configured as a set of data lines (e.g., top data lines). At least a portion of lines $270_B$, $271_B$, $272_B$, and $273_B$ (e.g., lines $271_B$ and $273_B$) can be configured as another set of data lines (e.g., bottom data lines). Lines $270_A$, $272_A$, $271_B$, and $273_B$ can carry signals BL0, BL2, BL1, and BL3, respectively.

Memory device 200 can include lines (e.g., access line) $250_0$, $251_0$, $252_0$, and $253_0$ that can carry corresponding signals $WL0_0$, $WL1_0$, $WL2_0$, and $WL3_0$. Lines (e.g., access lines) $250_1$, $251_1$, $252_1$, and $253_1$ can carry corresponding signals $WL0_1$, $WL1_1$, $WL2_1$, and $WL3_1$. Lines (e.g., access lines) $250_0$, $251_0$, $252_0$, and $253_0$ can carry corresponding signals $WL0_2$, $WL1_2$, $WL2_2$, and $WL3_0$. Lines (e.g., access lines) $250_2$, $251_2$, $252_2$, and $253_2$ that can carry corresponding signals $WL0_1$, $WL1_1$, $WL2_1$, and $WL3_1$.

FIG. 2A shows a particular number of access lines and data lines as an example. However, the number of these lines can vary.

Memory device 200 can include sense circuits 240, 241, 242, and 243, and transistors $220_A$, $221_A$, $222_A$, $223_A$ $220_B$, $221_B$, $222_B$, and $223_B$. These transistors can form part of a select circuit, such as select circuit 120 of FIG. 1.

In a memory operation (e.g., a read operation), transistors $220_A$ and $222_A$ can respond to a signal $BLS_A$ to couple lines $270_A$ and $272_A$ to sense circuits 240 and 242, respectively. Transistors $221_B$ and $223_B$ can respond to a signal $BLS_B$ to couple lines $271_B$ and $273_B$ to sense circuits 241 and 243, respectively. Signals $BLS_A$ and $BLS_B$ can have the same value during a memory operation. Thus, signal $BLS_A$ and $BLS_B$ can be the same signal.

Transistors $221_A$ and $223_A$ can respond to a signal $GBL_A$ to couple lines $271_A$ and $273_A$ to a node 299 (e.g., a common node). Node 299 can be coupled to a ground potential. Transistors $220_B$ and $222_B$ can respond to a signal $GBL_B$ to couple lines $270_B$ and $272_B$ to node 299. Signal $GBL_A$ and $GBL_B$ can have the same value during a memory operation. Thus, signal $GBL_A$ and $GBL_B$ can be the same signal.

Memory device 200 can include memory cells 210, 211, 212, and 213, and transistors (e.g., select transistors) 261, 262, 263, 265, 266, and 267. Memory cells 210, 211, 212, and 213 can be arranged in memory cell strings, such as memory cell strings 230, 231, 232, 233, 234, and 235. For simplicity, only six (230, 231, 232, 233, 234, and 235) of the 12 memory cell strings in FIG. 2A are labeled.

Each memory cell string in memory device 200 can be coupled to two associated transistors among transistors 261, 262, 263, 265, 266, and 267. For example, memory cell string 230 can be coupled to transistor 263 (directly over string 230) and transistor 267 (directly under string 230). FIG. 2A shows a memory cell string (e.g., 230, 231, 232, 233, 234, or 235) including only memory cells (e.g., 210, 211, 212, and 213) as an example. However, a memory cell string may not necessary include only memory cells. A memory cell string can include, in addition to memory cells, transistors (select transistors) coupled to the memory cells such as a transistor directly over the memory cells in the memory cell string and a transistor directly underneath the memory cells in the memory cell string. For example, in FIG. 2A, memory cell string 230 can include memory cells 210, 211, 212, and 213 and transistor 263 (directly over string 230) and transistor 267 (directly under string 230).

FIG. 2A shows an example of 12 memory cell strings and four memory cells 210, 211, 212, and 213 in each memory cell string. The number of such memory cell strings and the number of memory cells in each memory cell string can vary.

As shown in FIG. 2A, memory device 200 can include lines 281, 282, and 283 coupled to gates of transistors 261, 262, and 263, respectively. Lines 281, 282, and 283 can form part of select lines of memory device 200 and can carry signals $SG0_A$, $SG1_A$, and $SG2_A$ (e.g., top select gate signals), respectively. Memory device 200 can include lines 285, 286, and 287 coupled to gates of transistors 265, 266, and 267, respectively. Lines 285, 286, and 287 can form part of select lines of memory device 200 and can carry signals $SG0_B$, $SG1_B$, and $SG2_B$ (e.g., bottom select gate signals), respectively.

Transistors 261, 262, and 263 can be controlled (e.g., turned on or turned off) by signals $SG0_A$, $SG1_A$, and $SG2_A$, respectively. Transistors 265, 266, and 267 can be controlled (e.g., turned on or turned off) by signals $SG0_B$, $SG1_B$, and $SG2_B$, respectively. Signal $SG0_A$ and $SG0_B$ can have the same value during a memory operation. Thus, signal $SG0_A$ and $SG0_B$ can be the same signal. Signal $SG1_A$ and $SG1_B$ can have the same value during a memory operation. Thus, signal $SG1_A$ and $SG1_B$ can be the same signal. Signal $SG2_A$ and $SG2_B$ can have the same value during a memory operation. Thus, signal $SG2_A$ and $SG2_B$ can be the same signal.

In a memory operation (e.g., a read operation), sense circuits 240, 241, 242, and 243 can generate signals SDout0, SDout1, SDout2, and SDout3, respectively. The levels of signals SDout0, SDout1, SDout2, and SDout3 can be based on the levels of signals BL0, BL1, BL2, and BL3, respectively. The levels of signal SDout0, SDout1, SDout2, and SDout3 can be used to determine the states (e.g., values) of information stored in memory cells 210, 211, 212, and 213 of a selected memory cell set, as described in more detail below.

Figure 2B:
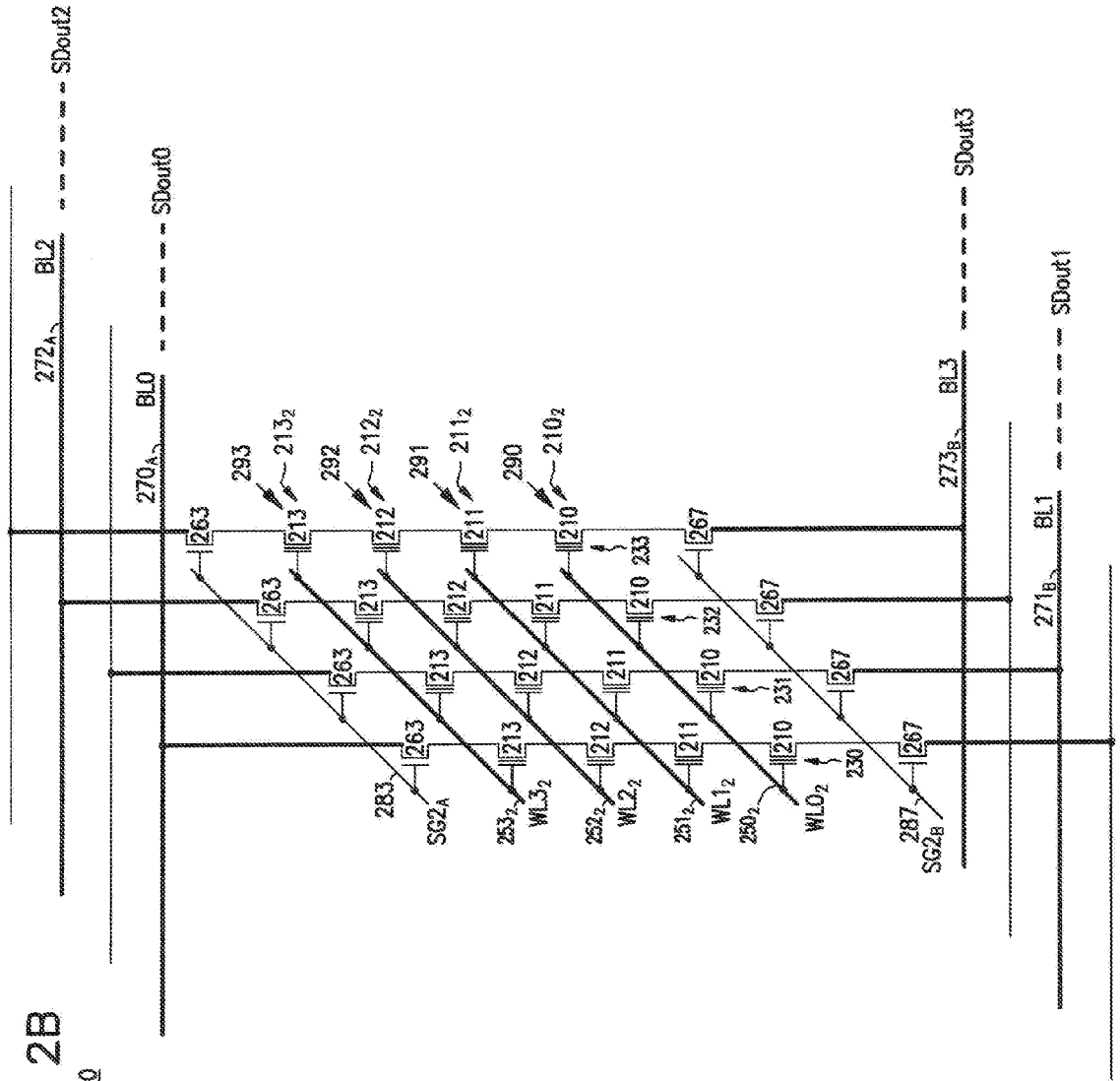
FIG. 2B repeats specific portions including memory cell sets of the memory device of FIG. 2A, according to an embodiment of the invention.

FIG. 2B repeats specific portions of the memory device of FIG. 2A, including memory cell sets formed by memory cells 210, 211, 212, and 213 of memory cell strings 230, 231, 232, and 233. As shown in FIG. 2B, memory cells 210, 211, 212, and 213 can be arranged in memory cell sets in rows, such that each of the memory cell sets can be included in a different row. For example, in FIG. 2B, memory cells 210 can be arranged in a memory cell set $210_2$ in row 290. Memory cells 211 can be arranged in a memory cell set $211_2$ in row 291. Memory cells 212 can be arranged in a memory cell set $212_2$ in row 292. Memory cells 213 can be arranged in a memory cell set $213_2$ in row 293. FIG. 2B shows an example of four memory cell sets in four respective rows; the number of memory cell sets and the number of corresponding rows can vary.

Memory cells of a memory cell set in a row can share (e.g., be directly coupled to) the same access line. For example, memory cells 210 of memory cell set $210_2$ can share the same line $250_2$. Memory cells 211 of memory cell set $211_2$ can share the same line $251_2$. Memory cells 212 of memory cell set $212_2$ can share the same line $252_2$. Memory cells 213 of memory cell set $213_2$ can share the same line $253_2$.

Each of the memory cell sets can include four memory cells from four different memory cell strings. For example, memory cell set $211_2$ can include four memory cells 210 from four different memory cell strings 230, 231, 232, and 233. In another example, memory cell set $211_2$ can include four memory cells 211 from four different memory cell strings 230, 231, 232, and 233. FIG. 2B shows an example of four memory cells in each memory cell set; the number of memory cells in each memory cell set can vary.

Memory cells in other memory cell strings (e.g., 234, 235, and other memory cell strings in FIG. 2A) of memory device 200 can also be arranged in memory cell sets in different rows similar to those of the memory cells of memory cell strings 230, 231, 232, and 233 of FIG. 2B.

In a memory operation (e.g., read or write operation), memory device 200 can select memory cell strings to access a memory cell set of the selected memory cell strings. For example, memory device 200 can select memory cell strings 230, 231, 232, and 233 to access a memory cell set $210_2$, $211_2$, $212_2$, or $213_2$. The memory cell sets in memory device 200 (FIG. 2A and FIG. 2B) can be selected one memory cell set at a time. A selected memory cell set refers to the memory cell set that is selected to be accessed in a memory operation, so that memory device 200 can (e.g., in a write operation) store information in memory cells in the selected memory cell set or obtain (e.g., in a read operation) stored information from memory cells in the selected memory cell set.

In FIG. 2A, memory device 200 can selectively turn on transistors 261, 262, 263, 265, 266, and 267 in a memory operation (e.g., a read or write operation). This enables a selected memory cell set included in the selected memory cell strings to be coupled to respective lines among lines $270_A$, $271_A$, $272_A$, and $273_A$ and lines $270_B$, $271_B$, $272_B$, and $273_B$.

In a memory operation, memory device 200 can turn on transistors (among transistors 261, 262, 263, 265, 266, and 267) that are associated with selected memory cell strings. For example, if memory cell set $211_2$ (FIG. 2B) is a selected memory cell set, memory device 200 can turn on transistors 263 and 267 by, for example, providing appropriate voltages to signals $SG2_A$ and $SG2_B$, respectively In a memory operation, memory device 200 can turn off transistors (among transistors 261, 262, 263, 265, 266, and 267) that are associated with unselected memory cell strings.

Unselected memory cell strings refer to the memory cell strings that have no memory cells included in the selected memory cell set. For example, in FIG. 2B, if memory cell set $211_2$ is the selected memory cell set, memory device 200 (FIG. 2A) can turn off transistors 261, 262, 265, and 266 by, for example, providing appropriate voltages to signals $SG0_A$, $SG2_A$, $SG1_B$, and $SG3_B$, respectively.

In a write operation, memory device 200 can concurrently store information in memory cells of a selected memory cell set. For example, if memory cell set $211_2$ in FIG. 2B is selected, then memory device 200 can concurrently store information in four memory cells 211 of memory cell set $211_2$. In this example, memory device 200 can store information in two memory cells 211 (in memory cell strings 230 and 232) based on values of signals on lines $270_A$ and $272_A$ (e.g., signals BL0 and BL2), respectively. Memory device 200 can store information in the other two memory cells 211 (in memory cell strings 230 and 232) based on values of signals on lines $271_B$ and $273_B$ (e.g., signals BL1 and BL3).

In a read operation, memory device 200 can concurrently obtain information from memory cells of a selected memory cell set. For example, in FIG. 2B, if memory cell set $211_2$ is selected, then memory device 200 can concurrently obtain information in memory cells 211 of memory cell set $211_2$. In this example, memory device 200 can obtain information from two memory cells 211 (in memory cell strings 230 and 232) based on values of signals on lines $270_A$ and $272_A$ (e.g., signals BL0 and BL2), respectively. Memory device 200 can obtain information in the other two memory cells 211 (in memory cell strings 230 and 232) based on values of signals on lines $271_B$ and $273_B$ (e.g., signals BL1 and BL3).

Thus, as described above, memory device 200 can perform an operation on a portion (e.g., one half) of the memory cells of a selected memory cell set through lines $270_A$ and $272_A$ (e.g., top data lines) and on another portion (the other half) of the memory cells of the selected memory cell set through lines $271_B$ and $273_B$ (e.g., bottom data lines). The operation can include a read or write operation.

FIG. 3 shows a schematic diagram of a portion of memory device 200 including sense circuit 240, according to an embodiment of the invention. As shown in FIG. 3, sense circuit 240 can include transistors 328 and 329 and a sense stage 325. Transistor 328 can be located between a supply node 306 and a node 370. Supply node 306 can be provided with a voltage (e.g., supply voltage) Vcc. Transistors 328 and 329 can be controlled by signals PreCh and Vclamp, respectively. Sense stage 325 can generate signals SDout0 based on signal SDin0. Transistors 328 and 329 are shown as part of sense circuit 340 as an example. Transistor 328 or 329, or both, can be separated from sense circuit 340. For example, transistor 328 can be part of a precharge circuit (not shown) and transistor 329 can be part of another circuit (e.g., a clamp circuit, not shown) of memory device 200.

FIG. 4 is a timing diagram for the signals of FIG. 3 during an example read operation of memory device 200 (FIG. 2A and FIG. 2B), according to an embodiment of the invention. In the read operation associated with FIG. 4, as described below, memory cell set $211_2$ in row 291 (FIG. 2B) is assumed to be a selected memory cell set. Thus, in FIG. 2B, line $251_2$ can be a selected access line. Lines $250_2$, $252_2$, and $253_2$ can be unselected access lines. During the example read operation, each of signals BL0, BL1, BL2, and BL3 (FIG. 2A) can indicate the state of a respective memory cell 211 of memory cell set $211_2$.

In FIG. 4, times T0 through T4 represent different times during a read operation. Voltages V0 through V8 represent different voltages that can be provided to the signals of FIG.

4. The values (e.g., 0.5V, 1V, 1.2V, 1.5V, and 5V) associated with the voltages in FIG. 4 are example values. Other values can be used. The waveforms in FIG. 4 are not scaled.

At time T0 during the read operation, signal $BLS_A$ can change from voltage V0 to voltage V8 to couple line $270_A$ (FIG. 3) to sense circuit 240. Signal PreCh can change from voltage V5 to voltage V0 to couple node 370 to supply node 306. Signal Vclamp can change from voltage V0 to voltage V4 to couple line $270_A$ to node 370. With this condition, signal BL0 can change from voltage V0 to voltage V1, indicating that line $270_A$ is charged (e.g., precharged) to voltage V1. Signal SDin0 can change from level 400 to level 401. Each of levels 400 and 401 can correspond to a certain voltage.

At time T1, signal Vclamp can change from voltage V4 to voltage V0 to decouple line $270_A$ from node 370. This may put line $270_A$ in a floating state (e.g., electrically unconnected to node 370 and sense stage 325).

At time T2, signals $SG2_A$ and $SG2_B$ (FIG. 2B) can change from voltage V0 to voltage V7. Signal $WL0_2$, $WL2_2$, and $WL3_2$ (associated with unselected access lines in this example) can change from voltage V0 to voltage V6. Signal $WL1_2$ (associated with the unselected access line in this example) can change from voltage V0 to voltage V2. The time interval from time T0 to time T2 can be a precharge time interval where line $270_A$ can be charged to voltage V1. Time T1 can be the beginning of the precharge time interval. Time T2 can be the end of the precharge time interval. Thus, at time T2 in FIG. 4, signal PreCh can change from voltage V0 to voltage V5 to decouple node 370 from supply node 306.

From time T2 and after, signal BL0 can have either voltage V0 or voltage V1, depending on the state of memory cell 211 (a selected memory cell) of memory cell string 230 (FIG. 2B). For example, if memory cell 211 of memory cell string 230 has one state, then signal BL0 can remain at voltage V1. If memory cell 211 of memory cell string 230 has another state, then signal BL0 can change (e.g., discharge) from voltage V1 to voltage V0. The state of a memory cell (e.g., memory cell 211 of memory cell string 230, in this example) corresponds to a value of information stored that memory cell.

The time interval from time T3 to time T4 can be a sense time interval where sense stage 325 can operate to sense the level (e.g., voltage) of BL0 (e.g., by way of signal SDin0). Thus, at time T3 in FIG. 4, signal Vclamp can change from voltage V0 to voltage V5 to couple line $270_A$ to node 370. At time T3, signal Vclamp can change from V0 to voltage V3. From time T3 and after, signal SDin0 can have either a level 400 or a level 401, depending on the voltage of signal BL0. For example, if signal BL0 has voltage V1, then signal SDin0 can remain at level 401. If signal BL0 has voltage V0, then signal SDin0 can change from level 401 to level 400.

At time T4, signals $SG2_A$, $SG2_B$, $WL0_2$, $WL1_2$, $WL2_2$, $WL3_2$, $BLS_A$, and Vclamp can change from their respective voltage to voltage V0. Signal SDout0 can have either a level 411 or a level 412, depending on state of memory cell 211 of memory cell string 230 (FIG. 2B). For example, signal SDout0 can have level 411 if memory cell 211 of memory cell string 230 has one state. Signal SDout0 can have level 412 if memory cell 211 of memory cell string 230 has another state. Each of levels 411 and 412 can correspond to a certain voltage.

Other sense circuits 241, 242, and 243 (FIG. 2A) of memory device 200 can include features similar to or identical to those of sense circuit 240 of FIG. 3. Thus, in a read operation of memory device 200, as described above with reference to FIG. 3 and FIG. 4, sense circuits 241, 242, and 243 and their associated signals can have waveforms similar to those shown in FIG. 4.

Memory device 200 (FIG. 2A) may have an improved (e.g., increased) data throughput. For example, in comparison with some conventional memory devices (e.g., devices with shielded data line architecture), the number of memory cells of memory device 200 that memory device 200 can concurrently access (e.g., in a read or operation) can be twice the number of memory cells that the conventional memory devices can access. The improved data throughput of memory device 200 can be attributed to the arrangement of data lines (e.g., top and bottom data lines, as described above with reference to FIG. 2A to FIG. 4).

Memory device 200 may also have an improved (e.g., lower) power consumption. For example, in comparison with some memory devices, memory device 200 may use only a portion (e.g., from time T3 to time T4 in FIG. 4) of a read operation to sense signals (e.g., BL0, BL1, B12, and BL3) on the data lines in order to determine the state of selected memory cells. Some conventional memory devices may use a relatively greater time interval for similar sensing. Since memory device 200 uses a smaller time interval for sensing during a read operation, its power consumption during a read operation may be lower than that of some conventional memory devices.

Figure 5B:
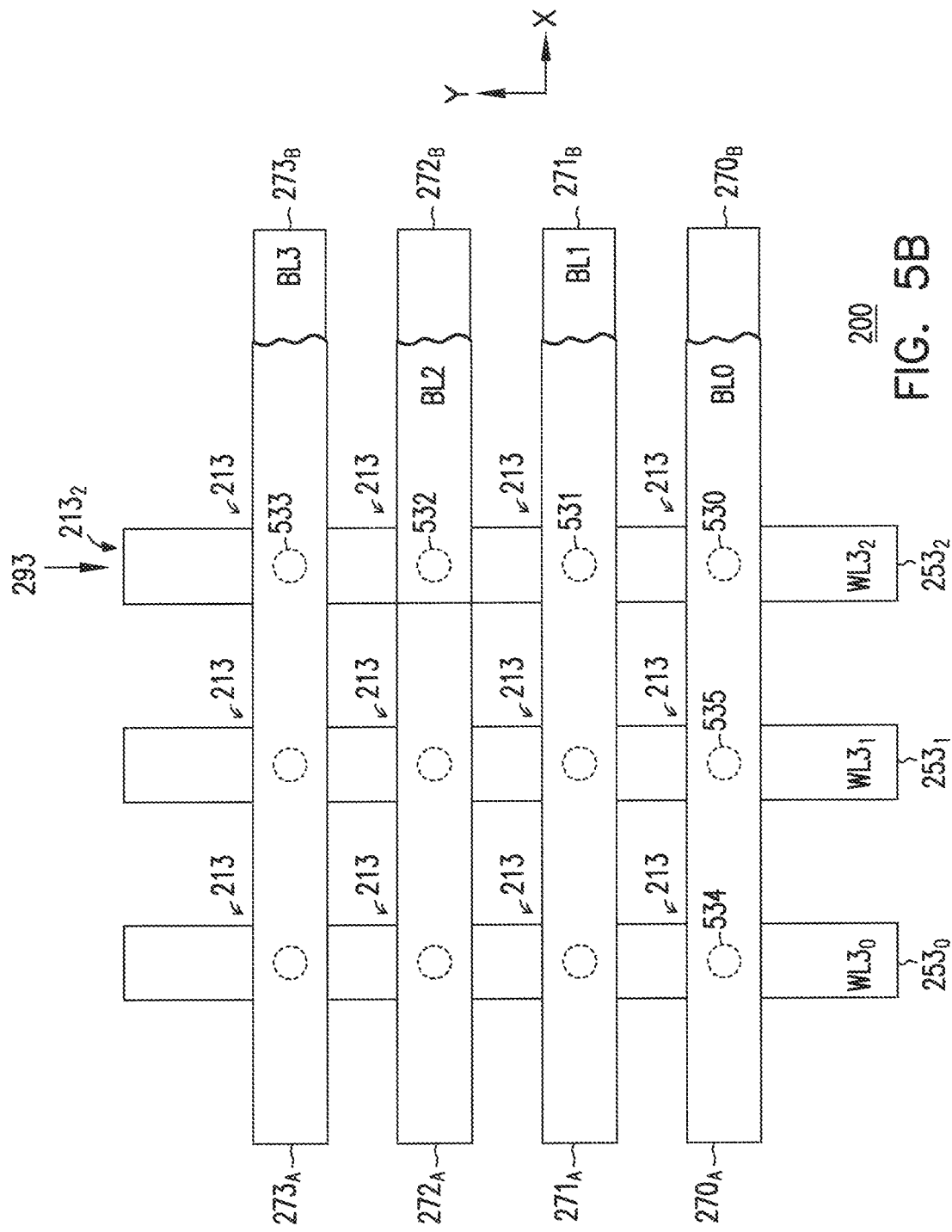
FIG. 5B shows a top view of the portion of the structure of the memory device of FIG. 5A, according to an embodiment of the invention.

FIG. 5A shows a side view of a portion of a structure of memory device 200 of FIG. 2A, according to an embodiment of the invention. FIG. 5B shows a top view of the structure of memory device 200 of FIG. 5A. FIG. 5C shows another side view of the structure of memory device 200 of FIG. 2A.

As shown in FIG. 5A, memory device 200 can include a substrate 515, which can be formed from a semiconductor material, such as silicon. Memory device 200 can include different levels 501 through 508 overlying substrate 515 in a Z-direction, which is substantially perpendicular (e.g., perpendicular) to an X-direction and a Y-direction (FIG. 5C).

In FIG. 5A, lines $270_B$, $271_B$, $272_B$, and $273_B$ can be located on level 501. Lines $270_A$, $271_A$, $272_A$, and $273_A$ can be located on level 508. Memory cells 210, 211, 212, and 213 can be located on levels 503, 504, 505, and 506, respectively. Lines $270_A$, $271_A$, $272_A$, and $273_A$ can be separate layers of conductive materials overlying memory cells 210, 211, 212 and 213 and substrate 515. Lines $270_B$, $271_B$, $272_B$, and $273_B$ can be separate layers of conductive material located in (e.g., formed in or formed on) substrate 515. FIG. 5B shows an example where lines $270_B$, $271_B$, $272_B$, and $273_B$ can be separate doped regions (e.g., conductive p-type or n-type doped regions) formed in substrate 515. However, lines $270_B$, $271_B$, $272_B$, and $273_B$ can be separate layers of conductive material formed over substrate 515.

Each of memory cell strings (e.g., 230, 231, 232, and 233) can be located between a respective line among lines $270_A$, $271_A$, $272_A$, and $273_A$ and a respective line among lines $270_B$, $271_B$, $272_B$, and $273_B$. Lines 283 and 287 can be located on levels 507 and 502, respectively.

As shown in FIG. 5A and FIG. 5C, transistors 261, 262, and 263 (FIG. 2A) can be located on level 507 and surrounded by corresponding lines 281, 282, and 283. Transistors 265, 266, and 267 (FIG. 2A) can be located on level 502 (FIG. 5C) and surrounded by corresponding lines 285, 286, and 287. Each of memory cell strings (e.g., 230, 231, 232, 233, 234, and 235) of memory device 200 can include a body region 561 having a length in the Z-direction. Access lines of memory device 200 can be located along the length of body regions of respective memory cell strings. For example, lines (e.g., access lines)

$250_2$, $251_2$, $252_2$, and $253_2$ can be located along the length of respective body regions 561 of memory cell strings 230, 231, 232, and 233.

As shown in FIG. 5A, FIG. 5B, and FIG. 5C, memory device 200 can include contacts, such as 530, 531, 532, 533, 544, and 535, coupled between respective memory cell strings (e.g., 230, 231, 232, 233, 234, and 235) and lines $270_A$, $271_A$, $272_A$, and $273_A$. Each of memory cell strings (e.g., 230 through 235) can also include a material 562 between body region 561 and corresponding access lines. For example, as shown in FIG. 5A, memory cell strings 230, 231, 232, and 233 can include material 562 between region 561 and lines $250_2$, $251_2$, $252_2$, and $253_2$. Material 562 can substantially surround body region 561. Each of access lines (e.g., $250_2$, $251_2$, $252_2$, and $253_2$ in FIG. 5A) can substantially surround a cross section of body region 561 of a respective memory cell string (e.g., 230, 231, 232, and 233). The cross section of body region 561 can have a circular shape. Body region 561 can include semiconductor material, such as silicon (e.g., doped polysilicon of p-type or n-type).

Material 562 can include a material (or materials) that can be configured to store information in memory cells 210, 211, 212, and 213. For example, material 562 can include charge storage material, such as a combination of a tunnel dielectric layer, a silicon oxide layer, and a charge blocking layer, or a combination of a silicon nitride layer, a polysilicon layer, and a nitride layer, or other materials that can provide a charge storage function to represent a value of information stored in the memory cells of memory cells 210, 211, 212, and 213. As an example, material 562 can include a combination of a tunnel dielectric directly contacting the body region 561, a charge storage material (e.g., polysilicon floating gate) directly contacting the tunnel dielectric, and a charge blocking material directly contacting the charge storage material.

FIG. 5B also shows the location of memory cell set $213_2$ that includes memory cells 213 arranged in row 293. As described above with reference to FIG. 2A and FIG. 2B, when a memory cell set is selected, information can be stored in (e.g., in a write operation) or obtained from (in a read operation) a portion of the memory cell set through different sets of data lines (e.g., top and bottom data lines). For example, in FIG. 5B, when memory cell set $213_2$ is selected, information can be stored in or obtained from two memory cells 213 of memory cell set $213_2$ through lines $270_A$ and $272_A$ (e.g., top data lines) and the other two memory cells 213 of memory cell set $213_2$ through lines $271_B$ and $273_B$ (e.g., bottom data lines).

Figure 6B:
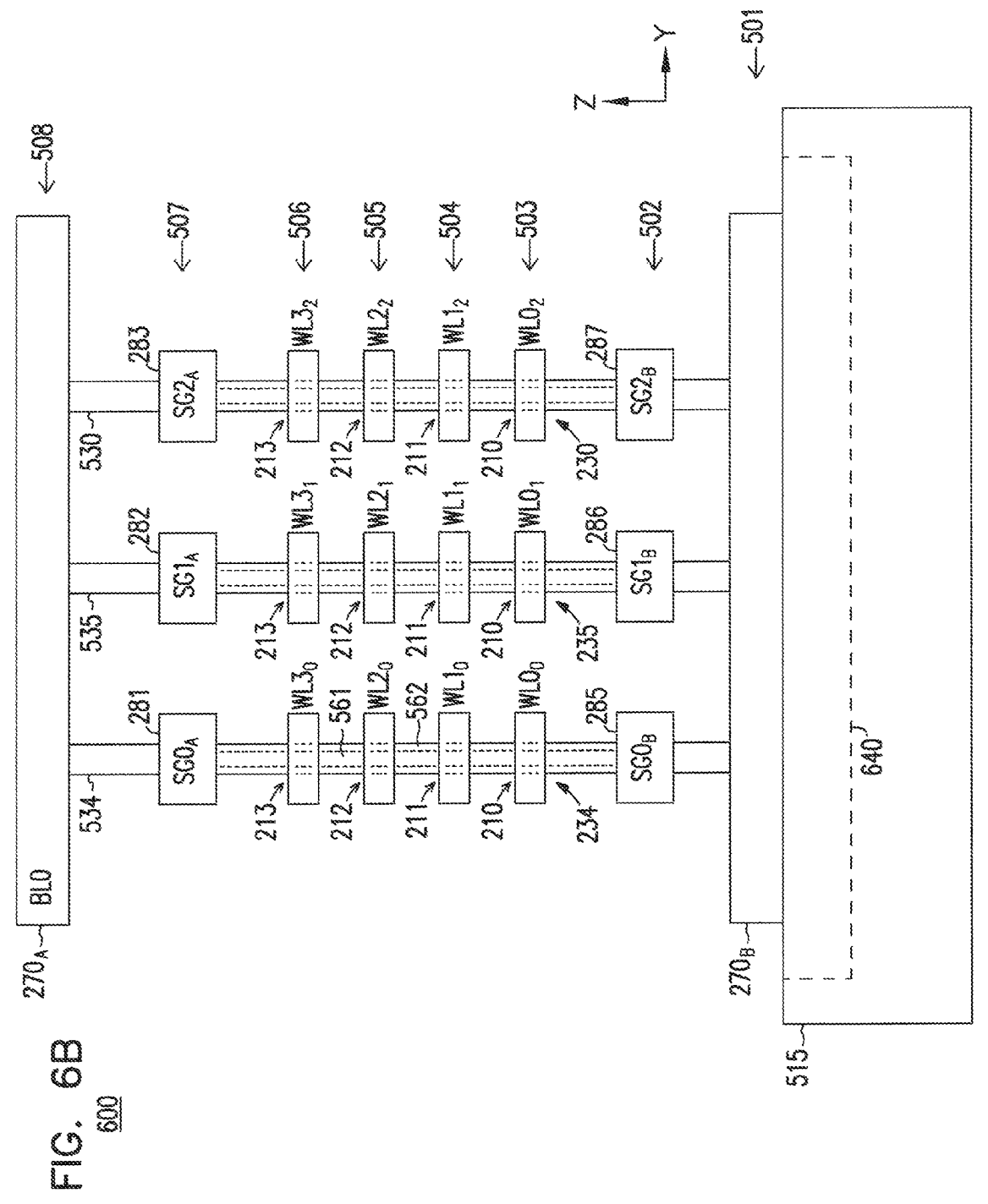

FIG. 6A shows a side view of a portion of a structure of a memory device 600 having lines $270_B$, $271_B$, $272_B$, and $273_B$ (e.g., including bottom data lines $271_B$ and $273_B$) formed over substrate 515, according to an embodiment of the invention. FIG. 6B shows another side view of a portion of the structure of memory device 600 of FIG. 6A, according to an embodiment of the invention.

Memory device 600 can be a variation of memory device 200 described above with reference to FIG. 2A through FIG. 5C. Thus, memory device 600 can include elements similar to or identical to those of memory device 200. For simplicity, the description of similar or identical elements between memory devices 200 and 600 is not repeated in the description of FIG. 6A and FIG. 6B.

As shown in FIG. 6A and FIG. 6B, lines $270_B$, $271_B$, $272_B$, and $273_B$ can be formed as separate layers of conductive material over substrate 515. Substrate 515 can include a portion 640 underneath lines $270_B$, $271_B$, $272_B$, and $273_B$. In portion 640, elements such as transistors for sense circuits of memory device 600 (e.g., similar to sense circuit 140 in FIG. 1, or sense circuits 240, 241, 242, and 243 in FIG. 2A) or for other elements of memory device 600 can be formed.

The illustrations of the apparatus (e.g., memory device 200) are intended to provide a general understanding of the structure of various embodiments and are not intended to provide a complete description of all the elements and features of an apparatus that might make use of the structures described herein.

The apparatuses (e.g., memory device 200 or part of memory device 200, including memory control unit 118 of FIG. 1 and sense circuit 240 of FIG. 2A and FIG. 3) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory device 200 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6B include apparatuses and methods having a first set of conductive lines, a second set of conductive lines, and memory cells located in different levels of the apparatus and arranged in memory cell strings. At least a portion of the first set of conductive lines is configured as a first set of data lines. At least a portion of the second set of conductive lines is configured as a second set of data lines. Each of the memory strings is coupled to a respective conductive line in the first set of conductive lines and a respective conductive line in the second set of conductive lines. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first set of conductive lines located on a first level of the apparatus, at least a portion of the first set of conductive lines configured as a first set of data lines;
   a second set of conductive lines located on a second level of the apparatus, at least a portion of the second set of conductive lines configured as a second set of data lines; and
   memory cells located in different levels of the apparatus and arranged in memory cell strings, each of the memory strings coupled to a respective conductive line in the first set of conductive lines and a respective conductive line in the second set of conductive lines.

2. The apparatus of claim 1, wherein the first set of conductive lines includes a first conductive line, a second conductive line, a third conductive line, and a fourth conductive line, the second conductive line arranged between the first and third conductive lines, the third conductive line arranged between the second and fourth conductive lines, wherein the first and third conductive lines are included in the first set of data lines, and the second and fourth conductive line are excluded from the first set of data lines.

3. The apparatus of claim 2, wherein the second set of conductive lines includes a fifth conductive line, a sixth conductive line, a seventh conductive line, and an eighth conductive line, the sixth conductive line arranged between the fifth and seven conductive lines, the seven conductive line arranged between the sixth and eighth conductive lines, wherein the sixth and eighth conductive lines are included in the second set of data lines, and the fifth and seven conductive lines are excluded from the second set of data lines.

4. The apparatus of claim 3, wherein the memory cell string includes a first memory cell string coupled to the first and fifth conductive lines, and a second memory cell string coupled to the second and sixth conductive lines.

5. The apparatus of claim 1, further comprising sense circuits, each of the sense circuits coupled to a respective data line in the first and second set of data lines, wherein a quantity of the sense circuits is equal to a quantity of the data lines in the first and second set of data lines.

6. The apparatus of claim 1, further including a substrate, wherein one of the first and second sets of data lines is located between the substrate and the memory cells.

7. The apparatus of claim 1, wherein the apparatus comprises a memory device.

8. The apparatus of claim 1, wherein the apparatus comprises a system including a memory device that includes the conductive lines and the memory cells.

9. A method comprising:
applying a signal to memory cells arranged in a row in a device
obtaining information from a first portion of the memory cells through a first set of data lines located in a first level of the device; and
obtaining information from a second portion of the memory cells through a second set of data lines located in a second level of the device.

10. The method of claim 9, further comprising:
coupling a data line in the first set of data line to a node; and
coupling the node to a supply node; and
decoupling the data line from the node.

11. The method of claim 10, further comprising:
decoupling the data line from the supply node; and
coupling the data line to the node.

12. The method of claim 11, further comprising:
generating a signal to indicate a state of a memory cell coupled to the data line.

* * * * *

UNITED STATES PATENT AND TRADEMARK OFFICE
CERTIFICATE OF CORRECTION

PATENT NO. : 8,780,631 B2
APPLICATION NO. : 13/590964
DATED : July 15, 2014
INVENTOR(S) : Toru Tanzawa Page 1 of 1

It is certified that error appears in the above-identified patent and that said Letters Patent is hereby corrected as shown below:

In the Claims
In column 11, line 8, in Claim 2, delete "line" and insert -- lines --, therefor.
In column 11, line 15, in Claim 3, delete "and seven" and insert -- and seventh --, therefor.
In column 11, line 15, in Claim 3, delete "the seven" and insert -- the seventh --, therefor.
In column 11, line 18, in Claim 3, delete "seven" and insert -- seventh --, therefor.

Signed and Sealed this
Thirteenth Day of January, 2015

Michelle K. Lee
*Deputy Director of the United States Patent and Trademark Office*